(12) United States Patent
Proppert et al.

(10) Patent No.: US 11,623,291 B2
(45) Date of Patent: Apr. 11, 2023

(54) SELECTIVE SOLDERING SYSTEM FOR SELECTIVE WAVE SOLDERING OF CIRCUIT BOARDS COMPRISING GRIPPING UNIT FOR EXCHANGING SOLDER NOZZLES

(71) Applicant: ERSA GmbH, Wertheim (DE)

(72) Inventors: Sven Proppert, Würzburg (DE); Theresa Christ, Steinfeld (DE)

(73) Assignee: ERSA GmbH, Wertheim (DE)

( * ) Notice: Subject to any disclaimer, the term of this patent is extended or adjusted under 35 U.S.C. 154(b) by 0 days.

(21) Appl. No.: 17/474,762

(22) Filed: Sep. 14, 2021

(65) Prior Publication Data

US 2022/0184726 A1    Jun. 16, 2022

(30) Foreign Application Priority Data

Sep. 16, 2020   (DE) ............... 10 2020 124 111.9

(51) Int. Cl.
| | |
|---|---|
| *B23K 3/00* | (2006.01) |
| *B23K 3/08* | (2006.01) |
| *B23K 1/08* | (2006.01) |
| *B23K 3/047* | (2006.01) |
| *B23K 3/06* | (2006.01) |

(52) U.S. Cl.
CPC ............. *B23K 3/087* (2013.01); *B23K 1/085* (2013.01); *B23K 3/047* (2013.01); *B23K 3/0653* (2013.01)

(58) Field of Classification Search
CPC ........ B23K 3/087; B23K 1/085; B23K 3/047; B23K 3/0653; B23K 3/06; B23K 1/08; H05K 3/3468

USPC ................................. 228/33, 37, 256, 260
See application file for complete search history.

(56) References Cited

U.S. PATENT DOCUMENTS

| | | | | | |
|---|---|---|---|---|---|
| 4,447,001 | A | * | 5/1984 | Allen | B23K 3/0653 228/37 |
| 5,156,324 | A | * | 10/1992 | Hueste | B23K 1/085 228/180.1 |
| 8,328,069 | B2 | * | 12/2012 | Isler | B23K 1/085 228/256 |
| 2015/0298233 | A1 | * | 10/2015 | Dreikorn | B23K 3/0646 228/33 |

(Continued)

FOREIGN PATENT DOCUMENTS

| | | |
|---|---|---|
| DE | 102004063488 A1 | 12/2006 |
| DE | 102016121160 A1 | 5/2018 |
| JP | H01143763 A | 6/1989 |

(Continued)

OTHER PUBLICATIONS

Machine translation of DE102016121160A1 (no date available).*

(Continued)

*Primary Examiner* — Kiley S Stoner
(74) *Attorney, Agent, or Firm* — George McGuire

(57) ABSTRACT

Selective soldering system for selective wave soldering of circuit boards, including a solder pot, a solder nozzle which can be detachably arranged on the solder pot, wherein the solder nozzle has a nozzle base and a nozzle neck, wherein at the free end of the nozzle neck a nozzle opening is provided, the solder pot being arranged on a moving unit, which can be moved along an x and y axis in a horizontal plane and along a z axis in the vertical direction, and a control unit for controlling the moving unit.

16 Claims, 5 Drawing Sheets

(56) References Cited

U.S. PATENT DOCUMENTS

2016/0228968 A1* 8/2016 Schütz .................. B23K 1/085

FOREIGN PATENT DOCUMENTS

| JP | H05208263 A | 8/1993 | | |
|----|-------------|--------|---|---|
| JP | 2000228572 A | 8/2000 | | |
| WO | WO-2006118138 A1 * | 11/2006 | ............. | B23K 1/085 |
| WO | 2014086954 A1 | 6/2014 | | |

OTHER PUBLICATIONS

Machine translation of JPH05208263A (no date available).*
Machine translation of JPH01143763A (no date available).*
German Office Action, dated May 17, 2021, 5 pages.

* cited by examiner

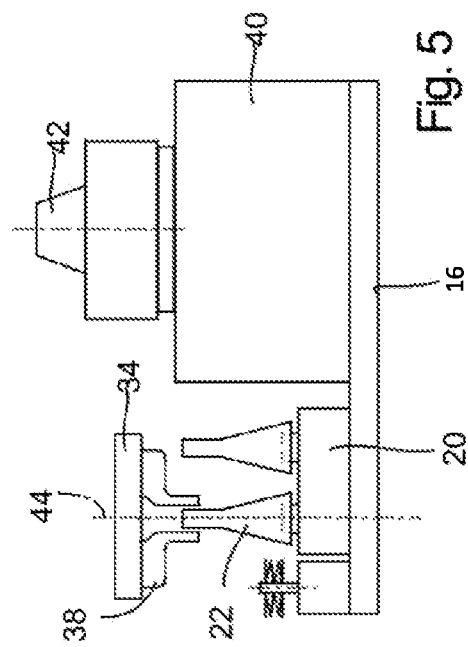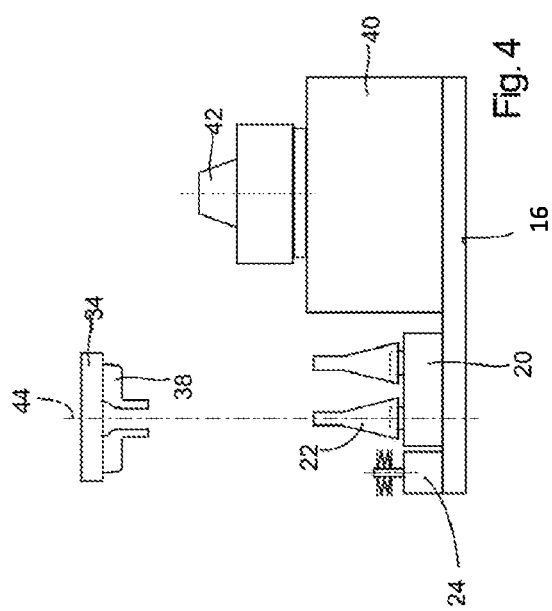

SELECTIVE SOLDERING SYSTEM FOR SELECTIVE WAVE SOLDERING OF CIRCUIT BOARDS COMPRISING GRIPPING UNIT FOR EXCHANGING SOLDER NOZZLES

CROSS-REFERENCE TO RELATED APPLICATION

The present application relates and claims priority to German Patent Application No. 10 2020 124 111.9 filed on Sep. 16, 2020, the disclosure of which is incorporated herein by reference in its entirety.

BACKGROUND

The invention relates to a selective soldering system for selective wave soldering of circuit boards, comprising a solder pot, comprising a solder nozzle which can be detachably arranged on the solder pot and which has a nozzle base and a nozzle neck, at the free end of which a nozzle opening is provided, the solder pot being arranged on a moving unit, which can be moved along an x and y axis in a horizontal plane and along a z axis in the vertical direction, and a control unit being provided for controlling the moving unit to move along the x, y, and z axes. The x, y, and z axes are each arranged orthogonally to one another.

In the field of contacting electronic components, which are fastened for example by means of through-hole technology (THT) from an upper side of a circuit board through a hole in the circuit board, it is known to contact the components from a lower side of the circuit board. So-called selective wave soldering has become known for contacting individual pins or rows of pins by soldering, in which a standing wave of a liquid solder is positioned exactly under an assembly or a pin to be contacted. It is also known, in so-called fluxing, to first spray a flux using a spray nozzle to improve the wetting by the solder on the pins/rows of pins to be soldered, individual pins then being soldered by spot soldering or rows of pins being soldered by moving a carriage from the first to the last pin of the row of pins.

It is also known to position a circuit board using a positioning device exactly above a standing wave of a solder pot statically arranged in a soldering system and then, for point soldering, to lower it or to raise the soldering wave until the standing wave of the solder contacts the pin. In this case, the entire circuit board is displaced relative to the standing wave generated in the solder pot. However, such a procedure has proven to be comparatively time-consuming.

Selective soldering systems having features of the preamble of claim 1 are known from DE 10 2004 063 488 A1 and WO 2014/086954 A1, in which systems the solder pot can be moved using the moving unit along the x, y, and z axes.

JP H05-208 263 A discloses an apparatus for dipping printed circuit boards in solder, JPH01-143 763A discloses a jet type soldering device, and JP 2000-228 572 discloses a formation of terminals of flexible circuit boards.

Depending on the component to be soldered, it may be necessary to provide solder nozzles with different nozzle openings. The nozzle openings can have different diameters and/or different contours. In addition, the solder nozzles are subject to wear during operation, in particular due to unwanted oxidation layers forming on the surface of the solder nozzle, which lead to undesired deformation of the soldering wave.

According to the prior art, it is known to manually replace worn solder nozzles using the appropriate tool. Such an exchange requires special protective measures due to the liquid solder in the solder pot and is time-consuming. It should also be taken into account that the solder nozzles should have a desired temperature when they are inserted in order to avoid undesired hardening of liquid solder when the solder nozzle is inserted into the solder pot. For this purpose, it is known to hold the solder nozzle for several seconds above the solder pot at a close distance from the liquid solder before insertion, so that in particular radiant heat emanating from the solder pot heats the solder nozzle to be inserted. Portions of the solder nozzle can also be held in the liquid solder so that it is washed around and heated by said liquid solder. Once the solder nozzle has reached a certain preheating temperature, it is manually inserted into the solder pot.

It is also known from DE 10 2016 121 160 A1 to arrange and remove solder nozzles on the solder pot using a handling device.

SUMMARY OF THE INVENTION

The problem solved by the invention is that of providing a selective soldering system by means of which the efficiency of the system is increased and a functionally reliable operation is nevertheless ensured.

This problem is solved by a selective soldering system.

Such a selective soldering system is characterized in that a magazine for receiving different solder nozzles is arranged on the moving unit. The magazine with the solder nozzles is consequently moved together with the movement of the moving unit. Because the magazine is arranged on the moving unit, no additional installation space is required for a fixed magazine. Furthermore, a gripping unit comprising gripping fingers for gripping the solder nozzle is provided, which can be controlled by the control unit, it being possible to move the gripping unit at least along the z axis using a drive unit which can be controlled by the control unit. The solder nozzle can consequently be gripped by the gripping unit when the solder nozzle is exchanged. The control unit is designed such that it controls the moving unit, the drive unit, and the gripping unit such that a solder nozzle in the magazine can be gripped, lifted, and deposited in the solder pot by the gripping unit. Before being deposited, the solder nozzle can be briefly preheated over the soldering wave. The control unit is advantageously also designed such that a nozzle in the solder pot can be gripped by the gripping unit, lifted, and discarded as a worn part or deposited in the magazine when reused.

An automated exchange of the solder nozzle is therefore possible with the invention. Because the magazine is arranged on the moving unit, no further unit is required in order to place the magazine perpendicularly under the gripping unit along the x, y, and optionally z axes. A solder nozzle can then be gripped, lifted, and deposited only in the z axis by moving the gripping unit.

It is advantageous if the gripping unit can only be moved along the z axis and not along the x and y axes. This means that an x-y axis drive for the gripping unit does not have to be included; the gripping unit is only moved in the vertical direction. The magazine can be moved in the horizontal direction and preferably also in the vertical direction by the moving unit.

It is particularly advantageous if the control unit is designed such that the gripping unit and the moving unit are synchronously moved toward and/or away from one another along the z axis. In this way, comparatively short movement times can be achieved and the set-up time for exchanging the solder nozzle can be minimized.

According to a further advantageous embodiment of the invention, a finger heater is provided for heating the gripping fingers before and/or at least during the gripping process to a preheating temperature. As a result, the gripped solder nozzle can be heated by the gripping fingers or held at a temperature that the nozzle may already be at during the gripping. The preheating temperature is in particular between 100° C. and 200° C. and more particularly between 120° C. and 180° C. and is more preferably in the region of 160° C. As a result, the start-up time of the solder nozzle, i.e., the time until the solder nozzle has reached its operating temperature after being inserted in the solder pot, can be significantly reduced, or even eliminated.

The finger heater can in particular be designed as an electrical resistance heater which is arranged on the gripping fingers or which is integrated into the gripping fingers. By appropriately energizing the resistance heater, the gripper fingers can be heated comparatively quickly to the desired preheating temperature. On the other hand, other types of finger heater are also conceivable, such as convection heaters or radiant heaters.

In order to achieve a desired preheating temperature, it is conceivable that temperature sensors are provided on the gripping fingers, by means of which the energization of the gripping fingers and thus the preheating temperature can be regulated.

It is also advantageous if a magazine heater is provided for heating the magazine and/or the solder nozzles in the magazine to a preheating temperature. By means of the magazine heater, solder nozzles in the magazine can consequently be heated to the desired preheating temperature before they are gripped by the gripping unit. In particular in combination with the finger heating, it can be ensured that the solder nozzles have a desired preheating temperature when they are inserted into the solder pot, which is preferably in the region of the later operating temperature. This means that there is no need to preheat the solder nozzle above the pot or the soldering wave. The start-up time of the solder nozzle in the solder pot can also be minimized or eliminated entirely. In order to achieve a desired preheating temperature here, too, it is conceivable that temperature sensors are provided on or in the magazine, by means of which the heating of the magazine and thus the preheating temperature can be regulated.

The magazine advantageously provides a magazine base, the magazine heater being provided in or on the magazine base. The magazine heater can in particular be an electrical resistance heater, preferably in the form of a surface or ring heating element. Depending on the geometric design of the magazine, other types of heaters can also be provided, such as convection heaters or radiant heaters.

It is also conceivable that the magazine has a cover element, and that the magazine heater is provided in or on the cover element. A cover element has the advantage that nozzles in the magazine are protected from contamination. The magazine heater in or on the cover element can preferably be an electrical resistance heater, particularly in the form of a surface or ring heating element.

According to another advantageous embodiment, a contact material is provided between the magazine heater and the solder nozzles for contact with the solder nozzles. The contact material preferably has, on the one hand, physical contact with the magazine heater and, on the other hand, physical contact with the solder nozzles, which can provide a favorable heat transfer.

It is advantageous if the contact material comes into contact with at least the nozzle neck of the nozzles in the magazine.

The contact material can be formed from metal wool, for example, which can be arranged on the inner side of the cover element. The metal wool as such can be designed to be elastically flexible, so that when the cover element is put on, the metal wool is elastically compressed due to the contact with the nozzles in the magazine. In this way, favorable heat transfer can be achieved.

The contact material can also be formed from metal elements which are mounted so as to be displaceable parallel to one another and the free ends of which act against the solder nozzles in the magazine. The metal elements are preferably arranged vertically on the cover element so that their weight acts against the solder nozzles. This also ensures a favorable heat transfer between the magazine heater and the solder nozzles.

According to a further advantageous embodiment, a cleaning unit, which is preferably arranged on the moving unit and can be controlled by means of the control unit, is provided for cleaning at least the nozzle base of a solder nozzle removed from the solder pot, and the control unit is designed such that a nozzle that is gripped and lifted from the solder pot by the gripping unit is moved into the cleaning unit and cleaned there before being deposited in the magazine. This has the advantage that solder nozzles removed from the solder pot do not have to be sorted out, but can be reused. The gripping unit then grips the solder nozzle in the solder pot. Due to the control of the moving unit and the drive unit, the gripped solder nozzle can be moved into the cleaning unit. If the gripping unit comprises heated gripping fingers, it can be achieved that, when the removed nozzle is moved from the solder pot to the cleaning unit, the solder nozzle does not cool down so much that cleaning by means of the cleaning unit is no longer possible or only with difficulty. It is, of course, particularly advantageous if the gripper finger heating ensures that the solder adhering to the solder nozzle does not harden. The solder nozzle cleaned in the cleaning unit can be deposited in the magazine after cleaning.

It is conceivable that a surveillance camera monitors the cleaning process and the cleaning result. Only when it is ensured that the solder nozzle has been appropriately cleaned is the relevant solder nozzle moved to the magazine and deposited there.

The cleaning unit as such can comprise a rotating metal brush for cleaning the nozzle base.

The control unit is also designed such that a solder pump provided in or on the solder pot for pumping the liquid solder can also be controlled using said control unit. The control can be such that shortly before reaching the deposited position, liquid solder is pumped through or in a nozzle holder and the solder nozzle is held just above the holder for preheating until the solder nozzle is at least largely homogeneously preheated. The solder pump can then be switched off and the solder nozzle deposited in the holder of the solder pot.

The problem mentioned at the outset is also solved by a method for exchanging a solder nozzle, in particular a selective soldering system according to the invention, the method comprising the following steps:

a. Moving the moving unit along the x, y, and/or z axes into an exchanging position in which the solder nozzle to be gripped is vertically below the gripping unit along the z axis,
b. Moving the gripping unit vertically downward along the z axis into a gripping position and gripping the solder nozzle in the magazine by means of a gripping unit. During the movement of the gripping unit along the z axis vertically downward, the moving unit can simultaneously be displaced vertically upward.
c. Moving the gripping unit together with the solder nozzle along the z axis vertically upward into a lifting position. At the same time, the moving unit can be shifted vertically downward along the z axis.
d. Moving the moving unit along the x, y, and/or z axes into a receiving position in which the solder pot, into which the solder nozzle is to be inserted, is below the gripped solder nozzle along the z axis;
e. Moving the gripped solder nozzle along the z axis vertically downward into the deposited position in which the solder nozzle is in the solder pot, and releasing the solder nozzle by the gripping unit. While the solder nozzle is moving vertically downward along the z axis, it is conceivable that the moving unit is moved vertically upward along the z axis.
f. Moving the gripping unit vertically upward along the z axis into a rest position. At the same time as moving the gripping unit vertically upward along the z axis, the moving unit can be moved vertically downward.
g. Pumping liquid solder through the solder nozzle.

It is conceivable that during steps a. to e. liquid solder is pumped in the solder pot or through or in a nozzle holder of the solder pot. In step e. the solder nozzle is briefly held just above the solder pot to preheat it just before reaching the deposited position, so that the solder nozzle is heated from below by the liquid solder and optionally washed by this until the solder nozzle is preheated at least largely homogeneously. The solder pump can then be switched off and the solder nozzle deposited in the solder pot or the nozzle holder. According to step g. liquid solder is then pumped through the solder nozzle; steps f and g. can also take place at the same time.

It is then conceivable to carry out a solder wave height test to ensure that the solder nozzle has the appropriate wave height. It is also conceivable to monitor the solder nozzle or the liquid solder emerging from the solder nozzle by means of a camera.

It is particularly advantageous if the method described is carried out such that the gripping fingers are heated to a preheating temperature before gripping the solder nozzle and/or if the solder nozzles in the magazine are heated to a preheating temperature before being gripped. As a result, preheating does not need to be included and, in particular, the start-up times of the solder nozzles after they have been inserted into the solder pot can be reduced, or even eliminated.

Further details and advantageous embodiments of the invention can be found in the following description, on the basis of which one embodiment of the invention shall be described and explained in more detail.

BRIEF DESCRIPTION OF THE DRAWINGS

In the drawings:
FIG. 4 is the moving unit and the gripping unit according to FIG. 3 in a side view in an exchanging position;
FIG. 5 is the view according to FIG. 4 in a gripping position.

DETAILED DESCRIPTION

Figure 1:
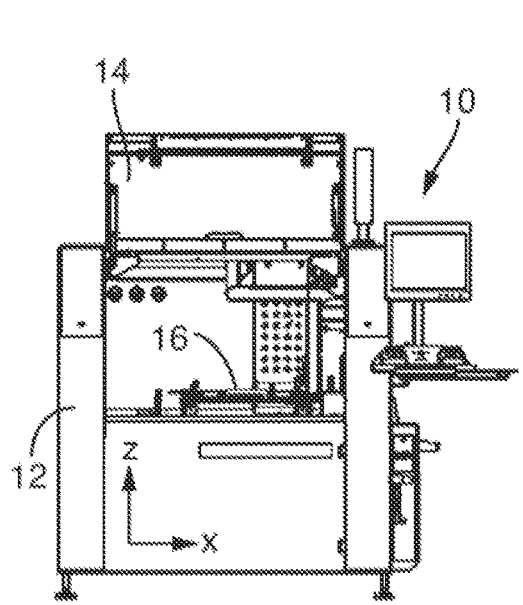
FIG. 1 is a front view of a selective soldering system according to the invention.
Figure 2:
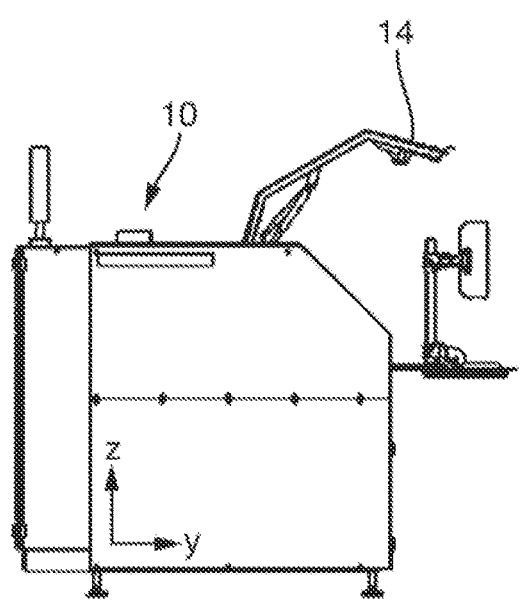
FIG. 2 is the side view of the selective soldering system according to FIG. 1.

FIGS. 1 and 2 show a selective soldering system 10 for wave soldering of circuit boards. The system comprises a housing 12 with a cover 14 which can close off the housing 12 and which is closed when the selective soldering system 10 is in operation. A moving unit 16 is provided within the housing 12, which moving unit can be moved in the horizontal plane along an x and y axis and in the vertical direction along a z axis.

Figure 3:
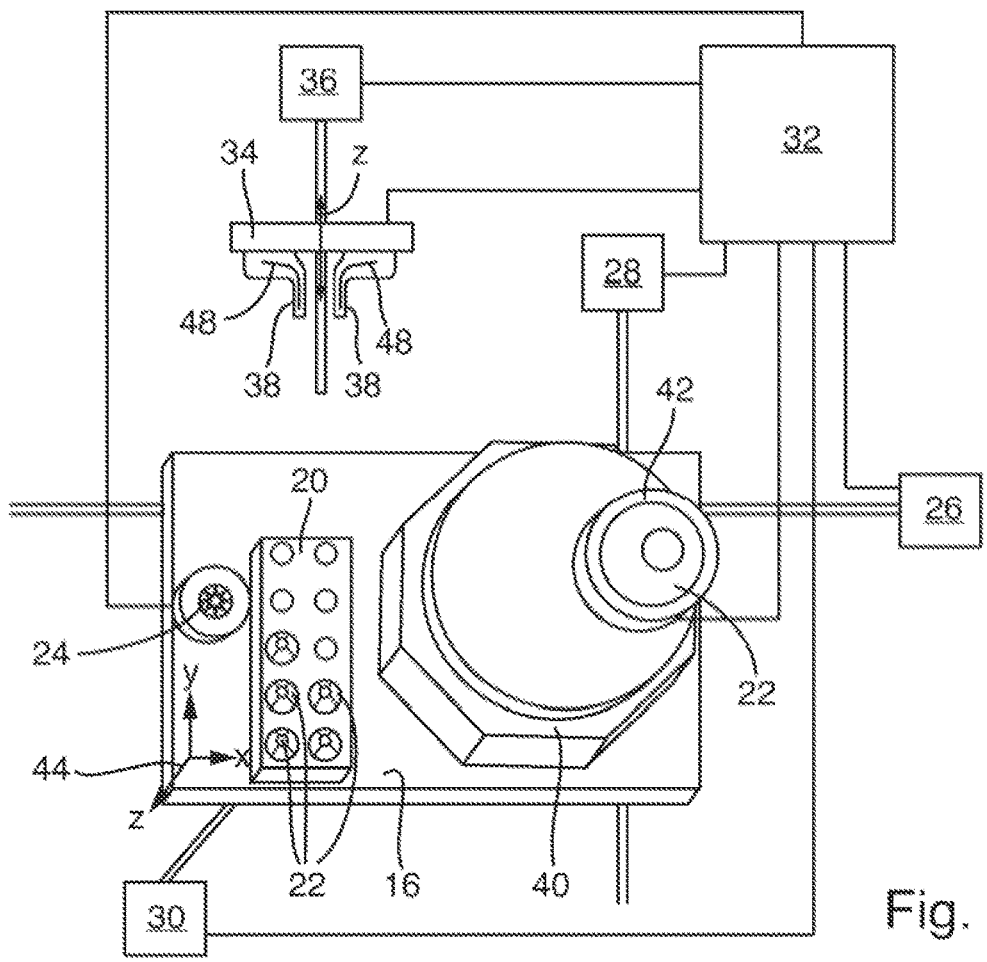
FIG. 3 is a schematic view of a moving unit and a gripping unit of the selective soldering system according to FIGS. 1 and 2.

The moving unit 16 is shown schematically in FIG. 3. A solder pot 40 for receiving liquid solder and a magazine 20 for receiving a total of ten solder nozzles 22 are provided on the moving unit 16, with a total of five solder nozzles 22 being inserted in the magazine. One of the solder nozzles 22 can be inserted into the solder pot 40. The solder pot 40 has a holder 42 for receiving a solder nozzle 22.

Furthermore, a cleaning unit 24 for cleaning solder nozzles 22 is provided on the moving unit 16. As also becomes clear from FIG. 3, a drive 26 is provided along the x axis and a drive 28 is provided along the y axis for displacing the moving unit 16. A z axis drive 30 is provided for moving the moving unit 16 along the z axis. The three drives 26, 28, 30 are controlled by a control unit 32.

In the vertical direction above the plane in which the moving unit 16 is located, a gripping unit 34 is provided, which can be moved in the vertical direction along the z axis by a drive unit 36. The gripping unit 34 has two gripping fingers 38 which can be moved toward and away from one another. The drive unit 36 and the movement of the gripping fingers 38 of the gripping unit 34 can be controlled via the control unit 32. The cleaning unit 24 is also actuated by the control unit 32.

The control unit 32 is designed to control the moving unit 16 and the gripping unit 34 with the drive unit 36 such that a solder nozzle 22 in the magazine 20 can be gripped by the gripping unit 34, lifted, and deposited in the solder pot 40.

The arrangement is preferably such that the gripping unit 34 can only be moved along the z axis and not along the x and y axes.

To exchange the solder nozzle 22, in a first step, which is shown in FIG. 4, the moving unit 16 can be moved along the x, y, and z axes in an exchanging position in which the solder nozzle 22 to be gripped in the magazine is below the gripping unit 34 along the z axis 44.

In a next step, the gripping unit 34 is then moved vertically downward along the z axis 44 into a gripping position as shown in FIG. 5. Upon or after reaching the gripping position, the gripping fingers 38 are moved toward one another and the solder nozzle 22 is gripped.

Figure 6:
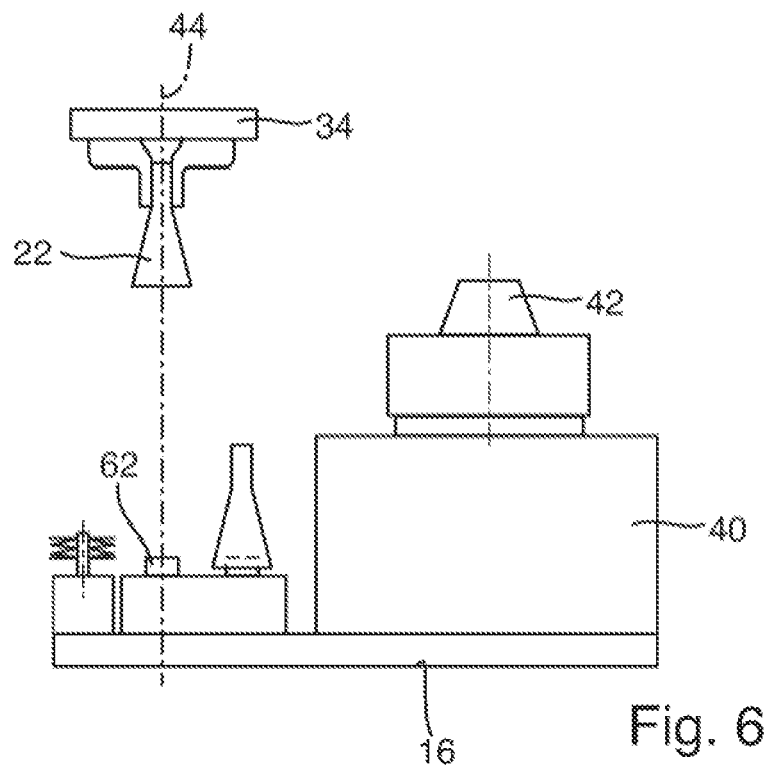
FIG. 6 is the view according to FIG. 5 in a lifting position.

The gripped solder nozzle is then, as shown in FIG. 6, displaced into a lifting position by moving the gripping unit 34 along the z axis 44 vertically upward.

Figure 7:
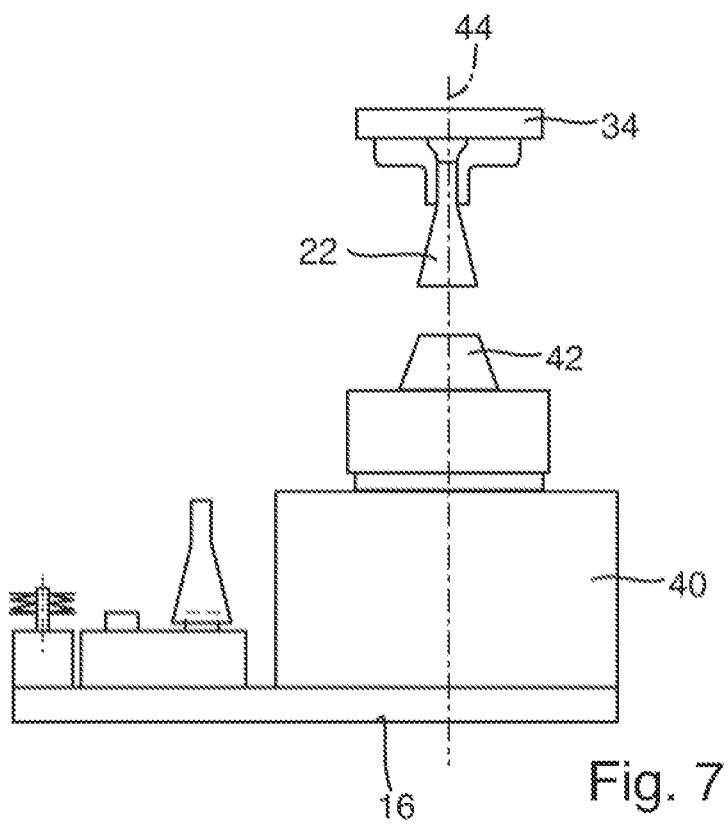
FIG. 7 is the view according to FIG. 6 in a receiving position.

In a next step, as shown in FIG. 7, the moving unit 16 is displaced horizontally along the x, y, and z axes, so that, in a receiving position, the solder pot 40 or the holder 42 of the solder pot 40 is below the gripped solder nozzle 22 along the z axis 44.

Figure 8:
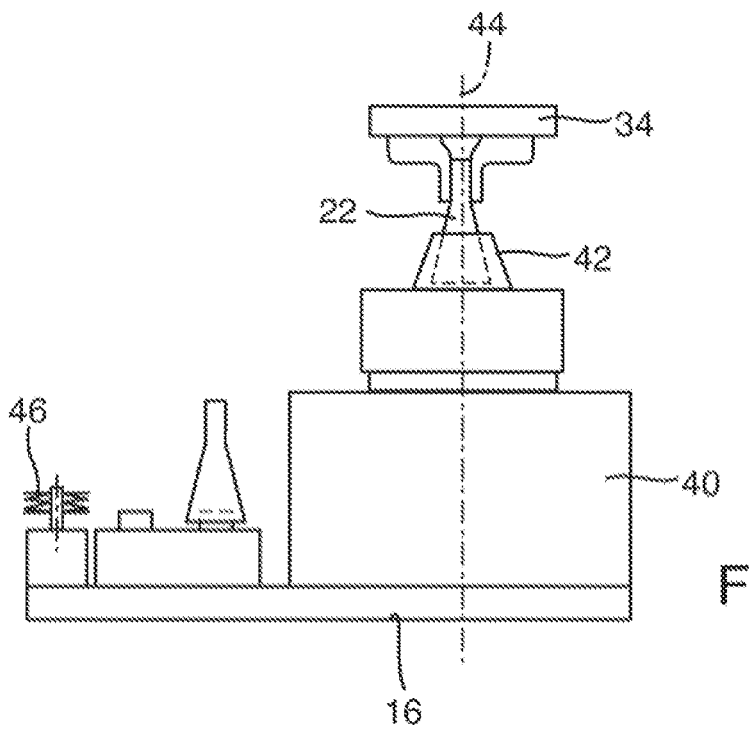
FIG. 8 is the view according to FIG. 7 in a deposited position in the solder pot.

Then, as shown in FIG. 8, the gripping unit 34 is moved vertically downward along the z axis into a deposited position, the gripping unit 34 then being released and, in a next step, it being possible to move the gripping unit 34 vertically upward into a rest position.

To shorten the described nozzle exchange process, it is conceivable that when the gripping device is moved along the x axis 44, the moving unit 16 is simultaneously moved along the z axis in the opposite direction of the gripping unit 34, which can result in shorter cycle times overall.

It is conceivable that, during the movement of the moving unit 16, liquid solder is pumped in or through the holder 42. Shortly before reaching the deposited position, the solder nozzle can be held just above the soldering wave flowing in or out of the holder 42 so that the solder nozzle 22 is heated from below by the soldering wave and, optionally, washed thereby until the nozzle 22 is at least largely homogeneously preheated. The solder pump can then be switched off and the solder nozzle 22 can be deposited in the solder pot 40.

The control unit 32 can also be designed such that a nozzle 22 in the solder pot 40 is gripped by the gripping unit 34, lifted, and, if the nozzle 22 is no longer required, discarded. In the event that the nozzle 22 is needed again, it can be cleaned and then deposited in the magazine 20.

Figure 9:
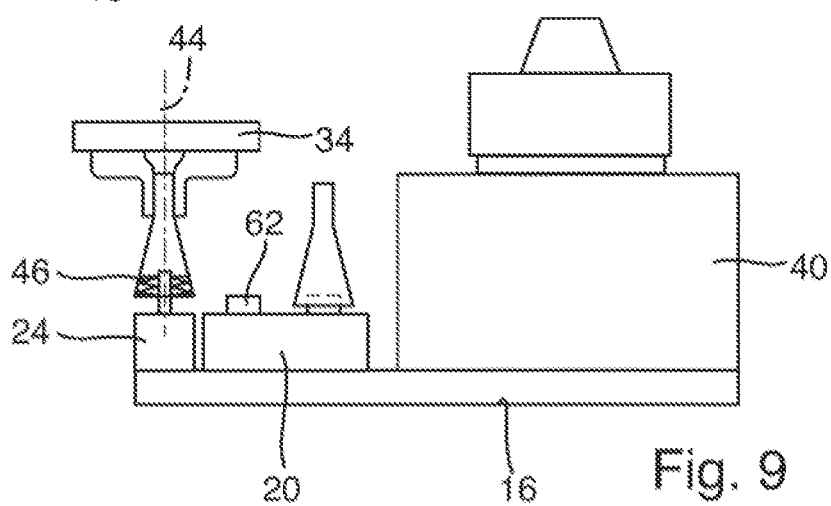
FIG. 9 is the view according to FIG. 8 in a cleaning position.
Figure 10:
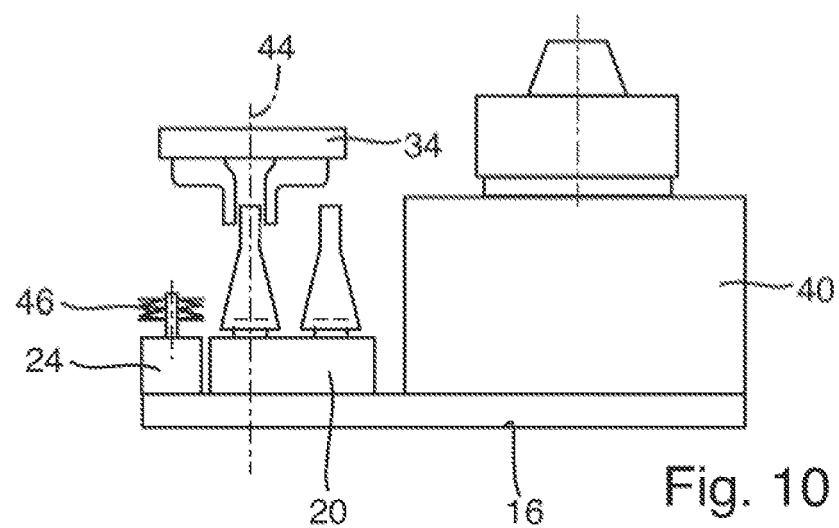
FIG. 10 is the view according to FIG. 9 in a deposited position in the magazine.

Cleaning of the nozzle 22 is indicated in FIG. 9, in which a nozzle 22 removed from the solder pot 40 is moved into the cleaning unit 24 before being deposited in the magazine 20 and cleaned there. For this purpose, the cleaning unit 24 comprises a rotating metal brush 46, onto which the nozzle base of the relevant nozzle 22, as shown in FIG. 9, can be deposited. In this way, at least the metal base can be cleaned. After cleaning the metal base, the nozzle 22 can be deposited on the magazine 20 at a place provided therefor.

In order to maintain or increase the temperature of the solder nozzle 22 during the gripping process, a finger heater 48, indicated in FIG. 3, is provided on or in the gripping fingers 38. The finger heater 48 is, in particular, an electrical resistance heater, which preheats the gripper fingers by applying a corresponding current. The finger heater 48 can be, in particular, in cavities in the gripping fingers 38, for example in holes provided for this purpose. The design is preferably such that the gripper fingers are heated to a preheating temperature of approx. 160° C. by the finger heater 48.

Figure 11:
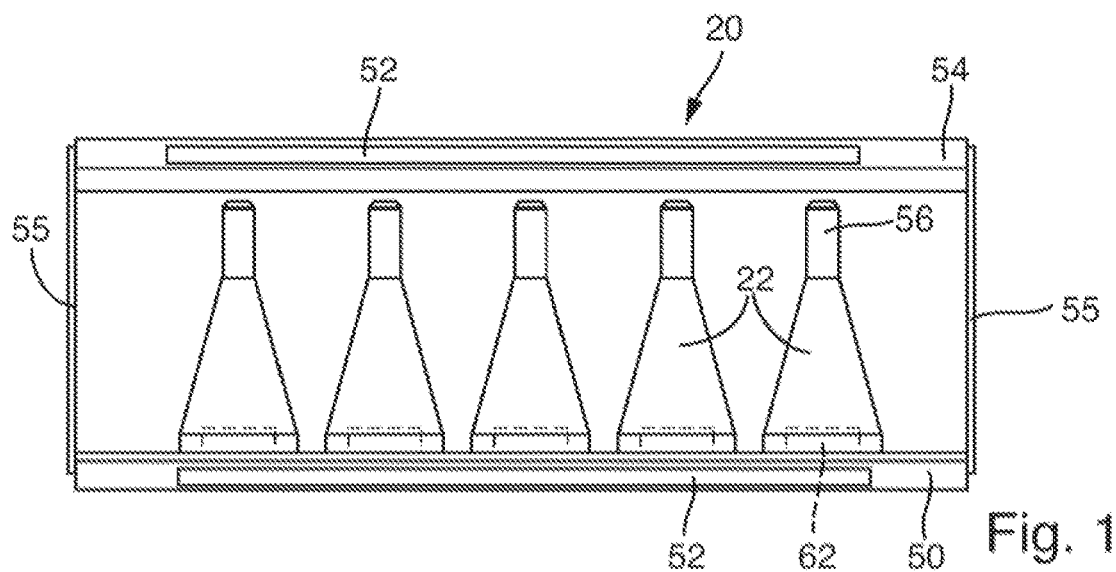
FIG. 11 is a first embodiment of a magazine.
Figure 12:
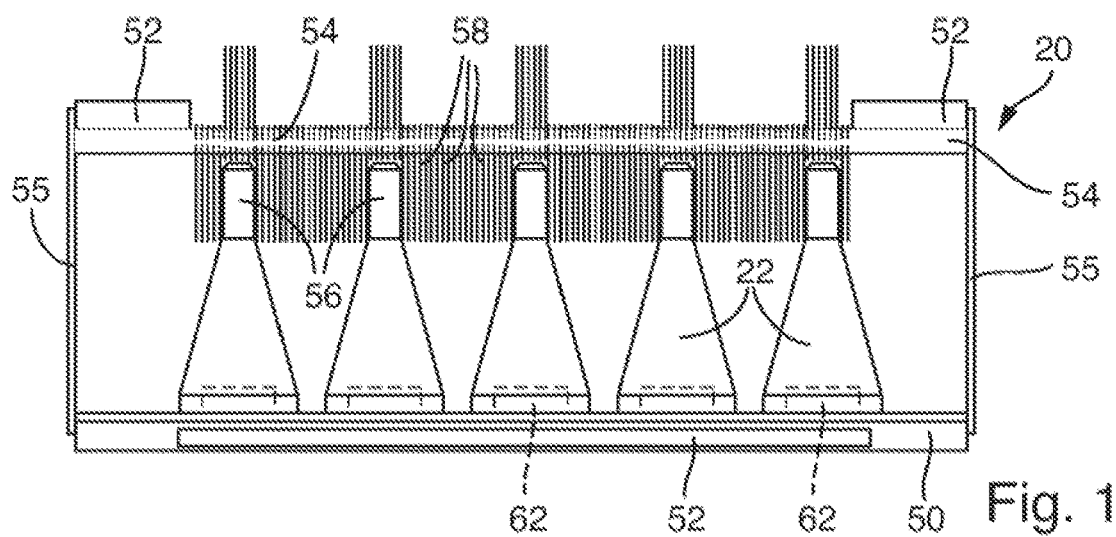
FIG. 12 is a second embodiment of a magazine.
Figure 13:
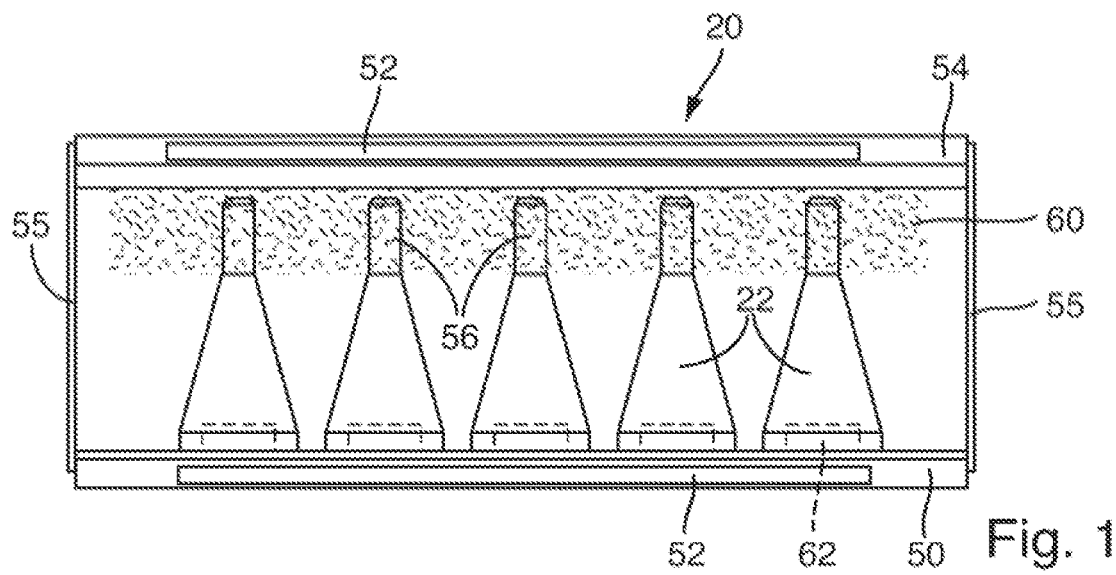
FIG. 13 is a third embodiment of a magazine.

A magazine heater 52 is also provided in the magazine 20, in particular in a magazine base 50, as shown in FIGS. 11 to 13. The magazine heater can also be designed as an electrical resistance heater and can be used, for example, as a surface or ring heating element.

To receive the solder nozzles 22 in a precise position, a receiving element 62, for example in the form of a base, can be provided on the upper side of the magazine bottoms 50.

In the case of the magazines 20 provided in FIGS. 11 to 13, the magazine bottom 50 is covered by means of a cover element 54, which can be designed as a lid element, for example. Side walls 55 are provided between the relevant magazine bottom 50 and the cover element 54. The side walls 55 can preferably be arranged on the magazine bottom 50. The cover element 54 can, in particular, be arranged displaceably so that it allows access to the solder nozzles 22 in an open position.

Such a cover element 54 can protect the solder nozzles 22 in the magazine 20 and can also help ensure that these are provided at a largely constant preheating temperature.

In the embodiment shown in FIG. 11, a magazine heater 52 is provided in the magazine base 50, which is designed as an electrical resistance heater and, as a surface heating element, extends more or less over the entire bottom 50. A magazine heater 52 can also be provided in the cover element 54, so that the solder nozzles 22 are also preheated from above.

In the embodiment according to FIG. 12, a contact material in the form of metal pins 58 mounted so as to be displaceable parallel to one another is provided between the nozzle necks 56 of the nozzles 22 and the cover element 54. Due to the weight of the individual metal pins, which are mounted displaceably in the cover element 54, they act vertically downward against the nozzle necks 56. Due to the magazine heater 52 provided in the cover element 54, which can be designed here around the circumference as a ring element, the metal pins 58 are preheated and thus conduct the heat into the nozzle necks 56. The metal pins 58 preferably have an identical length, so that where the free ends of the metal pins 58 come to rest on the upper side of the nozzle necks 56, the metal pins 58 protrude in the vertical direction beyond the cover element 54. Overall, this results in a favorable heat transfer from the magazine heater 52, which is in or on the cover element 54, to the solder nozzles 22.

In the embodiment according to FIG. 13, a magazine heater 52 is also provided in the cover element 54. Furthermore, a contact material in the form of metal wool 60 is provided on the inner side of the cover element 54 facing the solder nozzles 22. The metal wool 60 is elastically resiliently deformable and thus comes to rest on the nozzle necks 56 when the cover element 54 is in place. In this embodiment, too, a suitable heat transfer from the magazine heater 52 provided in the cover element 54 to the nozzle necks 56 can be implemented.

The design when a cover element 54 is provided is preferably such that the cover element 54 is automatically lifted or pivoted to the side before a solder nozzle 22 is gripped, so that the gripping unit 34 can grip the nozzle necks of the solder nozzles that are then freely accessible.

What is claimed is:

1. Selective soldering system for selective wave soldering of circuit boards, comprising a solder pot, comprising a solder nozzle which can be detachably arranged on the solder pot, wherein the solder nozzle has a nozzle base and a nozzle neck, wherein at the free end of the nozzle neck a nozzle opening is provided, the solder pot being arranged on a moving unit, which can be moved along an x and y axis in a horizontal plane and along a z axis in the vertical direction, and comprising a control unit for controlling the moving unit, characterized in that a magazine for receiving different solder nozzles is arranged on the moving unit, in that a gripping unit comprising gripping fingers for gripping the solder nozzle is provided, which can be controlled by the control unit, wherein the gripping unit can be moved along the z axis using a drive unit being controlled by the control unit, and wherein the control unit being designed such that it controls the moving unit, the drive unit and the gripping unit, in such a way that a solder nozzle in the magazine can be gripped, lifted, and deposited in the solder pot with the gripping unit.

2. Selective soldering system according to claim 1, characterized in that the drive unit is designed such that the gripping unit can only be moved along the z axis, and in that when the solder nozzle is gripped and lifted, the moving unit moves the solder pot along the x, y, and z axes.

3. Selective soldering system according to claim 1, characterized in that the control unit is designed such that it controls the moving unit and the drive unit such that the magazine and the gripping unit are moved toward and/or away from one another along the z axis.

4. Selective soldering system according to claim 1, characterized in that a finger heater is provided for heating the gripping fingers to a preheating temperature before and/or during the gripping process.

5. Selective soldering system according to claim 4, characterized in that the finger heater is designed as an electrical resistance heater which is arranged on the gripper fingers or integrated into the gripper fingers.

6. Selective soldering system according to claim 1, characterized in that a magazine heater is provided for heating the magazine and/or the solder nozzles in the magazine to a preheating temperature.

7. Selective soldering system according to claim 6, characterized in that the magazine has a magazine bottom, and in that the magazine heater is provided in or on the magazine base.

8. Selective soldering system according to claim 6, characterized in that the magazine has a cover element, and in that the magazine heater is provided in or on the cover element.

9. Selective soldering system according to claim 6, characterized in that a contact material is provided between the magazine heater and the solder nozzles for contact with the solder nozzles.

10. Selective soldering system according to claim 9, characterized in that the contact material is formed from metal wool.

11. Selective soldering system according to claim 8, characterized in that the contact material is formed from metal elements which are mounted so as to be displaceable parallel to one another and the free ends of which act against solder nozzles in the magazine.

12. Selective soldering system according to claim 1, characterized in that a cleaning unit, which can be controlled the control unit, is arranged for cleaning the nozzle base of a solder nozzle removed from the solder pot, and in that the control unit is provided such that a solder nozzle that is gripped and lifted from the solder pot by the gripping unit is moved into the cleaning unit and cleaned there before being deposited in the magazine.

13. Selective soldering system according to claim 12, characterized in that the cleaning unit is provided on the moving unit.

14. Selective soldering system according to claim 12, characterized in that the cleaning unit comprises a rotating metal brush for cleaning at least the nozzle base.

15. Method for exchanging a solder nozzle of a selective soldering system, comprising the following steps:
  a. Moving a moving unit along the x, y, and/or z axes into an exchanging position in which a solder nozzle in the magazine and to be gripped is vertically below a gripping unit along the z axis,
  b. Moving the gripping unit vertically downward along the z axis into a gripping position and gripping the solder nozzle in the magazine by means of a gripping unit,
  c. Moving the gripping unit together with the solder nozzle along the z axis vertically upward into a lifting position,
  d. Moving the moving unit along the x, y, and/or z axes into a receiving position in which a solder pot, into which the solder nozzle is to be inserted, is vertically below the gripped solder nozzle along the z axis,
  e. Moving the gripped solder nozzle along the z axis vertically downward into a deposited position in which the solder nozzle is in the solder pot, and releasing the solder nozzle by the gripping unit,
  f. Moving the gripping unit vertically upward along the z axis into a rest position.

16. Method according to claim 15, characterized in that the gripping fingers are heated to a preheating temperature before gripping the solder nozzle and/or in that the solder nozzles in the magazine are heated to a preheating temperature before being gripped.

* * * * *